(12) United States Patent
Tarone (10) Patent No.: US 8,604,801 B2
(45) Date of Patent: Dec. 10, 2013

(54) CONNECTOR FITTING TEST TOOL

(75) Inventor: Robert J. Tarone, Chalfont, PA (US)

(73) Assignee: General Instrument Corporation, Horsham, PA (US)

( * ) Notice: Subject to any disclaimer, the term of this patent is extended or adjusted under 35 U.S.C. 154(b) by 560 days.

(21) Appl. No.: 12/761,978

(22) Filed: Apr. 16, 2010

(65) Prior Publication Data

US 2010/0264936 A1    Oct. 21, 2010

Related U.S. Application Data

(60) Provisional application No. 61/171,155, filed on Apr. 21, 2009.

(51) Int. Cl.
*G01R 31/04* (2006.01)

(52) U.S. Cl.
CPC .................................. *G01R 31/045* (2013.01)
USPC ........................................................ 324/538

(58) Field of Classification Search
None
See application file for complete search history.

(56) References Cited

U.S. PATENT DOCUMENTS

| | | | | |
|---|---|---|---|---|
| 3,420,090 A | * | 1/1969 | Saddoris et al. | 73/9 |
| 3,766,777 A | * | 10/1973 | Roveti | 73/862.01 |
| 3,808,874 A | * | 5/1974 | Trevithick | 73/9 |
| 3,922,600 A | * | 11/1975 | Roveti | 324/508 |
| 4,136,560 A | * | 1/1979 | Gellos | 73/146.8 |
| 4,777,828 A | * | 10/1988 | Ferris | 73/744 |
| 4,884,175 A | * | 11/1989 | Weng | 362/119 |
| 5,357,062 A | * | 10/1994 | Rockwell et al. | 178/19.04 |
| 5,606,123 A | * | 2/1997 | Rabizadeh | 73/146.8 |
| 5,640,776 A | * | 6/1997 | Krauss | 33/203 |
| 5,870,835 A | * | 2/1999 | Stieff | 33/600 |
| 7,528,825 B2 | * | 5/2009 | Sakurai et al. | 345/179 |

* cited by examiner

*Primary Examiner* — Paresh Patel
(74) *Attorney, Agent, or Firm* — Lori Anne D. Swanson (57) ABSTRACT

A compact and easy to use female connector testing tool includes an outer housing containing a movable plunger. A male connection end is attached to one end of the movable plunger. A predetermined resistive force is provided between the outer housing and the plunger to provide adequate resistance against movement between them. As the tool is pulled away from the female connector, in which the male connection end is inserted, the plunger moves with respect to the outer housing. An indicator indicates if the female connector has passed (and is good) or has failed. The indicator may be used to provide measurements of the pullout or push-in force required to remove or insert the male connector from the female connector. The indicator may include a pass/fail indicator, a graded scale, an electronic display or audible display. A mechanical pullout mechanism may be used to provide a fast test of the holding resistance of the female connector.

16 Claims, 5 Drawing Sheets

CONNECTOR FITTING TEST TOOL

PRIORITY CLAIM

The present application claims the benefit of priority to U.S. Provisional Patent Application Ser. No. 61/171,155, filed on Apr. 21, 2009, entitled "Cable Fitting Test Tool", the disclosure of which is hereby incorporated by reference in its entirety.

BACKGROUND

Many electrical devices contain male and female connectors to allow them to be connected to networks or other electrical devices. Electrical communication signals pass through the connector on one end to the connector on the other end when the connectors are in good electrically conductive contact. When the electrical connectors are not in good electrical contact, the electrical communication signals may become degraded in passing through the connection. The degraded signal often causes the electrical devices to provide degraded data to the users, such as providing a television picture with missing data, or a tiled image.

Electrical connectors often have a male end and a female end. The female end often contains a metal insert which engages with a metal probe or male connector on the male end with a desired amount of holding force when inserted to form an electrical connection. When the holding force is sufficient, a good electrical connection is made, allowing communications to pass between the two ends without substantial degradation in signal quality. The female electrical connector is often intended to hold the male connector within a range of tolerances. For example, an F-connector for receiving a coaxial cable is commonly expected to be able to accept a center conductor with a diameter in the range of 0.64-1.07 mm, have center contact depth of 9.65 mm minimum, and after 50 insertions/extractions of a male connector, maintain 25 grams load for 10 seconds when a 0.020 polished steel pin is inserted.

When the holding force or pullout resistance of the female connector is insufficient, such as if the female connector is worn or damaged, a poor connection or no connection is often associated with the insufficient holding force. In the instance of a poor connection, a communication signal passing between the two may become degraded to the point of being unacceptable to an end user or receiving device. The degradation may be in the form of dropping data or providing intermittent data.

Identifying a female connector as being worn or damaged is a difficult problem to assess without specialized testing equipment. In some instances, the female connector, for example an F connector, includes a center conductor receptacle which is buried deep within the fitting and cannot be easily seen (e.g. an F connector normally has about 9.65 mm minimum center contact depth). When the inner workings of the conductor become worn or damaged, it is very difficult to detect the faulty connector.

A faulty connector often causes the electrical device, such as a set top box (STB) to be returned for diagnostics and repair. The return of a STB often requires a technician to go to a user's house ("a truck roll") to diagnose that the user has a problem, take the STB away to a service provider facility, and return the STB from the service provider to the manufacturer of the STB or a repair facility. The STBs are tested, diagnosed and repaired. The current process requires extensive use of resources to diagnose and repair a STB. However, the problem is often the result of a faulty connector. What is needed is a tool to quickly and easily diagnose the connection quality of a female connector to shorten the repair times of the electrical devices.

SUMMARY OF INVENTION

In accordance with the principles of the invention, a connector testing tool may comprise: a housing having a hollow body; a plunger contained in the hollow body and being movable within the hollow body; a male connector end connected to the plunger to be inserted in a female connector to be tested; and a resistance mechanism which provides a predetermined amount of force resisting movement between the housing and the plunger, wherein the resistance mechanism resists movement of the plunger when the male connector is being pulled out of a female connector being tested.

The connector testing tool may further comprise an indicator which indicates a pass or fail condition of the female connector being tested.

The indicator may include an indicator in the hollow body and a pass band on the plunger. The indicator may include a scale band on the plunger. The indicator may include a movable measurement band which is to be moved by a key on the plunger. The indicator may include an LED on the plunger. The indicator may include an electronic device configured to make an audible noise.

In the connector testing tool the resistance mechanism may include resistance bands on the plunger. The resistance mechanism may include a spring. The resistance mechanism may include a pullout resistance mechanism configured to resist movement of the plunger while pulling the male connector end out of the female connector, and the resistance mechanism may include a push-in resistance mechanism configured to resist movement of the plunger while pushing the male connector end into the female connector. An indicator may indicate an amount of pullout resistance and an amount of push-in resistance.

A connector testing tool in accordance with the invention may comprise: a housing having a hollow body; a plunger contained in the hollow body and being movable within the hollow body; a male connector end connected to the plunger to be inserted in a female connector to be tested; and a mechanical pullout mechanism which is configured to apply a pullout force against the plunger to pull the male connector out of the female connector.

The connector testing tool may include a locking mechanism which locks the mechanical pullout mechanism in a tensioned state, while the male connector end is inserted in the female connector. In the connector testing tool, when the locking mechanism is activated such that the mechanical pullout mechanism applies a predetermined amount of pullout force against the plunger. The female connector may be determined to pass the test based on the male connector being resistively held by the female connector for a minimum period of time.

A method of testing a connector in accordance with the principles of the invention may comprise the steps of: inserting a male connector end of a testing tool into a female connector, the testing tool having an outer housing holding a movable inner plunger, the male connector end being mounted on the inner plunger; providing an indication of movement of the plunger within the outer housing, the movement of the plunger being resisted between the outer housing by a resistance mechanism; determining if the connector has passed based on an amount of movement of the plunger with respect to the outer housing.

In the method the step of providing an indication of movement of the plunger may include proving an indication of a minimum plunger movement distance for a pass designation. The step of providing an indication of movement of the plunger may include proving an indication of an amount of force exerted to move the plunger. The female connector may be determined to pass if movement of the plunger indicates a predetermined pullout force is needed to remove the male connector from the female connector. The female connector may be determined to pass if movement of the plunger indicates a predetermined push-in force is needed to insert the male connector into the female connector.

The tool permits the user to quickly test female connectors while mounted on an electronic device. The tools allows a technician to quickly diagnose a faulty female connector, reducing repair time and repair costs associated with failed electronic devices. The tool also allows many electronic components to be tested in a short period of time, further reducing repair times. The tool is preferable small and lightweight and can be easily and conveniently carried by a user. The tool also enables testing of many electronic devices without the need to disconnect the devices from a power source or to power down the devices from other connections, such as a network connection.

BRIEF DESCRIPTION OF DRAWINGS

Features of the present invention will become apparent to those skilled in the art from the following description with reference to the figures, in which.

DETAILED DESCRIPTION

For simplicity and illustrative purposes, the present invention is described by referring mainly to exemplary embodiments thereof. In the following description, numerous specific details are set forth to provide a thorough understanding of the present invention. However, it will be apparent to one of ordinary skill in the art that the present invention may be practiced without limitation to these specific details. In other instances, well known methods and structures have not been described in detail to avoid unnecessarily obscuring the present invention. In addition, different embodiments may be used in combination with each other.

Figure 1A:
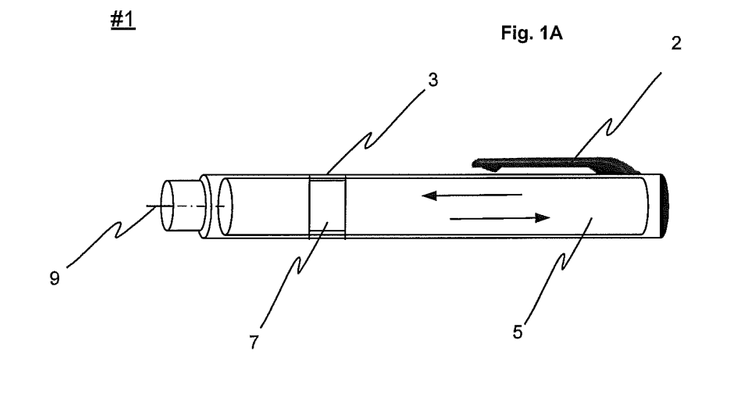
FIGS. 1A-1C illustrate an example of a testing tool in accordance with a first embodiment of the invention.
Figure 1B:
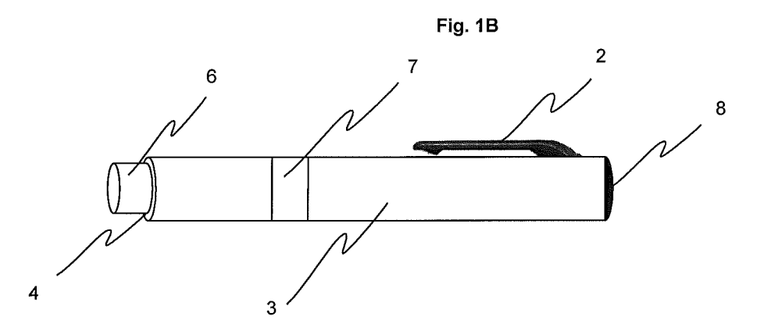
Figure 1C:
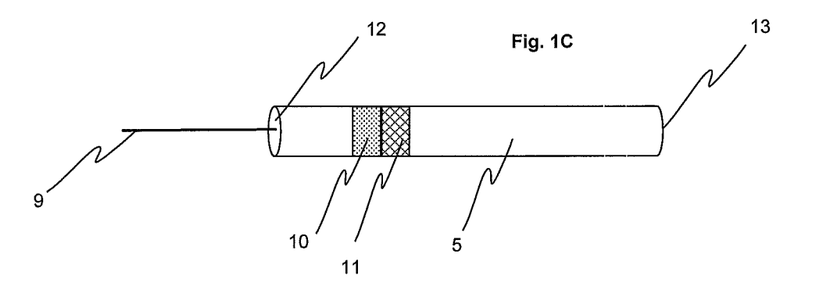

FIGS. 1A-1C illustrate an example of a testing tool in accordance with a first embodiment of the invention. The tool 1 may be the size of the average highlight marker. The tool may consist of, an outer tube or housing 3 and an inner tube or plunger that fits inside of the housing 3. An example of an assembled tool is illustrated in FIG. 1A. As shown in FIG. 1A, a clip attachment 2 may be included to allow the tool 1 to be mounted on an article of clothing of the user. In operation, the plunger 5 moves from a home position inside housing 3 to an extended measurement position An example of a housing 3 for the tool 1 is shown in FIG. 1B. As shown in FIG. 1B, the tool 1 may have an outer housing 3 formed of a generally hollow body, an alignment sleeve 6, a slot 7 which may serve as an indicator window, an interior front end 4, an interior back end 8, and a mounting clip 2. The alignment sleeve 6 (front of the tool) may be sized and shaped to match the female connector under test and used to guide the tool on to the female connector, such as a cylindrical sleeve to mount on a typical F-fitting. The alignment sleeve also conceals most of the male connector 9 when the male connector is positioned in a home position. In operation, the alignment sleeve 6 preferably helps the user to insert and remove the tool 1 cleanly from the female connector. The housing 3 may be opaque, and slot 7 may be notched into the opaque housing revealing the "pass/fail" bands. Those of skill in the art will appreciate that the housing may be transparent or partially transparent, and the indicator may be in the form of markings indicating a measurement area.

FIG. 1C illustrates an example of an inner tube or plunger 5. The plunger 5 holds male connector 9, a fail indicator band 10, a pass indicator band 11, a front end 12 and a back end 13. Male connector 9 is preferably sized and shaped to match a typical male connector intended to make an electrical connection with a specific female connector, such as a stinger being the same diameter of a coaxial cable to be inserted in an F-connector. Other male connectors may include HDMI, DVI, RCA, Mini Phone and Ethernet male connectors. The length of the male connector 9 may be substantially equal to the distance between the slot 7 and an end of pass band 11, such that pass band 11 is fully exposed at the extended position.

In one implementation, the plunger 5 slides inside of the housing 3 between a home position and an extended position. At the home position, the back end 13 of plunger 5 substantially abuts against an interior back end 8 of housing 3. At the extended position, the front end 12 of plunger 5 substantially abuts against interior front end 4 of housing 3. When in the home position, the tool is inserted into a female connector, such as an F-fitting, such that the male connector 9 preferably reaches the connector's mechanical clasp deep within the female connector. When the male connector 9 is inserted in the female connector, the housing 3 is pulled away from the female connector. If there is significant mechanical resistive holding resistance or pullout resistance of the female connector on the male connector 9, the male connector 9 will be held in place while the housing 3 slides over the plunger 5. The plunger 5 will continue to slide inside the housing 3 until the front end 12 of the plunger 5 reaches the interior front end 4 of the housing 3, i.e. the extended position is reached. As the plunger 5 slides inside of the housing 3, the pass indicator 11 will become visible through the housings slot 7. If there is insufficient mechanical holding resistance or pullout resistance between the female connector and male connector 9 to slide the plunger 5 inside of housing 3, e.g. to overcome a mechanical resistance between plunger 5 and housing 3, to cause the plunger 5 to move within the housing 3 as it is being pulled, the plunger 5 will not move from the home position, leaving the "fail band" 10 exposed in the slot 7. A failure will be detected.

The pullout resistance of the female connector places on the male connector 9 may be determined. Those of skill in the art will appreciate that the test mimics the pullout resistance that the female connector places on an inserted male connector, such as a coaxial cable's center conductor inserted in an F-connector. When the pullout resistance is sufficient, e.g. 25 grams for a typical F-connector, a good electrical connection between the female connector and the male connector is presumed to be made, allowing electrical communication without significant degradation or signal loss passing through the connection.

The mechanical resistance between the plunger 5 and the housing 3 may be obtained by creating an adequate sliding resistance between the exterior surface, or a portion of the exterior surface, of the plunger 5 and the housing 3. Such sliding resistance may be created by forming fail band 10 and/or pass band 11 as a ring sized to provide a desired amount of restive friction against the interior of housing 3. Alternatively, an additional ring or band (not shown) may be used to increase the outer diameter of the plunger 9. Those of skill in the art will appreciate that an appropriate sized ring or band may be chosen to achieve a desired level of mechanical resistance to create a pass/fail threshold for the connector under review. The user or technician may increase or decrease the mechanical resistance as desired by adding thicker bands or thinner bands as desired. The ring or bands may also be made of a material which may produce a desired amount of mechanical resistance against the interior of housing 3, such as rubber, plastic, metal or any other suitable material. The inside surface of housing 3 may also be machined or coated to produce a desired mechanical resistance between housing 3 and plunger 5.

The mechanical resistance between the plunger and housing may be variably increased, such as by gradually decreasing the diameter of the housing to increase the frictional engagement with the plunger or bands on the plunger as it is moved within the housing.

The mechanical sliding resistance between housing 3 and plunger 5 may also be obtained by a spring mechanism attached to the plunger 5 and the housing 3. The tension of the spring may provide the desired resistive tension to create a pass/fail threshold for the connector under review.

The pass fail indicator 11/10 may be colored or patterned portions, spots, or bands on the plunger, or simply indicated by visible motion of the plunger. For example, a green band may indicate a pass condition and red band a fail condition. As another example, a vertical line pattern (e.g. aligned with the length of the plunger) may indicate a pass condition and a horizontal line pattern may indicate a fail condition. A combination of colors and patterns may also be used.

The pullout resistance of the female connector under test may be equated to the amount of force applied by the pulling action to move plunger 5 against the sliding resistance without out overcoming the female connector's holding force (i.e. without withdrawing the male connector). The measured pullout resistance may be provided in a mechanical display, such as a marker (e.g. needle or pin or line) in a indicator on the housing aligning with indicators (e.g. numbers, letters, colors or patterns) on the plunger. Alternatively, the marker may be on the plunger and indicators on an elongated window on the housing. The pullout resistance displayed may also be in the form of an electronic readout display, a multiple LED display and/or audible (mechanical or electric) display. The tool may also be equipped with a minimal amount of circuitry and electronics (e.g. a processor and a memory) to store the pass fail condition or measured pullout resistance.

The pass fail indicator 11/10 may also or alternatively be configured to provide an audible noise in the event of a pass or fail, such as click sound to indicate that the plunger has moved to a pass position. Those of skill in the art will appreciate, that various mechanisms can be used to create a "click" sound, such as by rapidly deforming a metal plate or snapping a lever arm against the plunger.

Figure 2A:
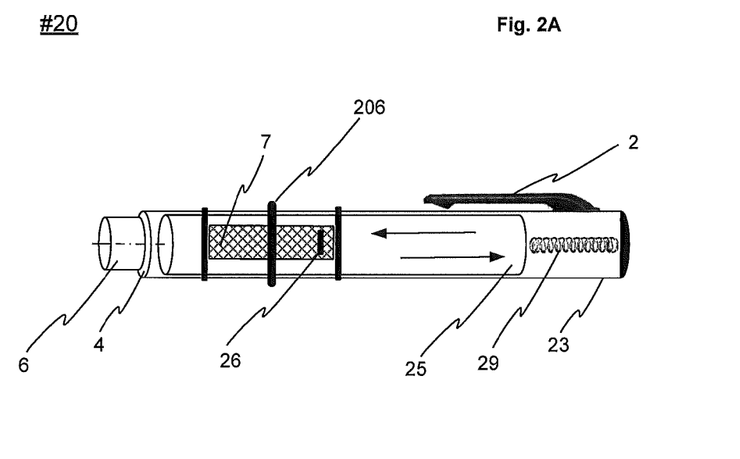
FIGS. 2A-2C illustrate a testing tool in accordance with another embodiment of the invention.
Figure 2B:
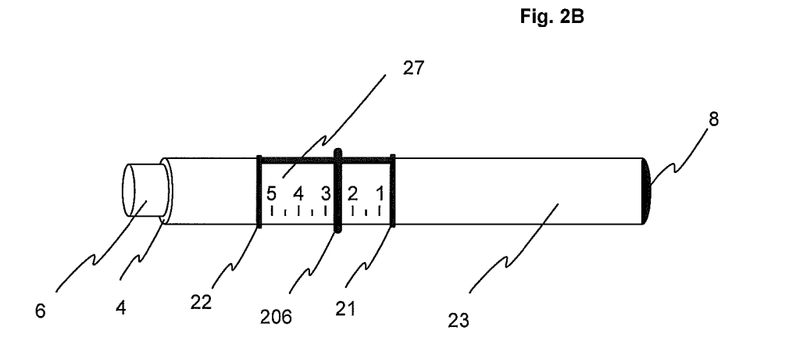
Figure 2C:
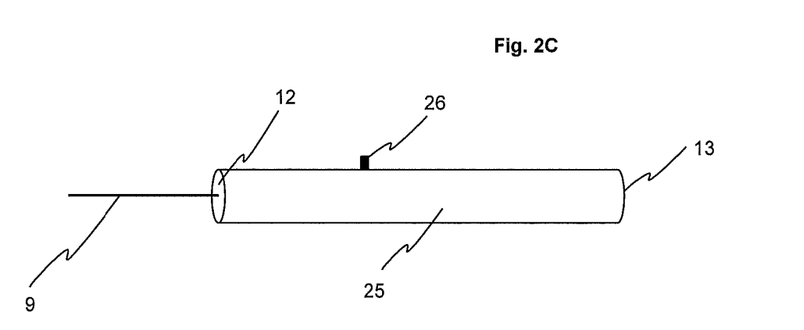

FIGS. 2A-2C illustrate a testing tool in accordance with another embodiment of the invention. As shown in FIG. 2A, tool 20 may include a housing 23 holding plunger 25 with a spring 29. The operation of tool 20 is generally similar to tool 1 except the sliding resistance between housing 23 and plunger 25 is provided by spring 29 and the indicator provides a measurement scale rather than a pass/fail indicator.

FIG. 2B illustrates further details of housing 23. As shown in FIG. 2B, housing 23 may include an outer housing formed of a generally hollow cylindrical body, an alignment sleeve 6, a slot 7, indicator 27, an interior front end 4, an interior back end 8, and a mounting clip 2. Housing 23 may also include a spring mounting unit (not shown) to securely attach spring 29 onto housing 23. Those of skill in the art will appreciate that a variety of approaches may be used to attach spring 29 to housing unit 23, such as adhesives, screws, and/or inserting the end of the spring into a notch. Indicator 27 may include a fixed home band 21, a fixed extended band 22 and a movable measurement band 206.

FIG. 2C illustrates further details of plunger 25. The plunger 25 contains male connector 9, an indicator key 26, a front end 12 and a back end 13. In one implementation, the plunger 25 slides inside of the housing 23 between a home position and an extended position. At the home position, the indicator key 26 of plunger 25 substantially abuts against home band 21 of housing 23. At the extended measurement position, the indicator key 26 of plunger 25 substantially abuts against extended band 22 of housing 23. When in the home position, the tool 20 is inserted into a female connector, such as an F-fitting, such that the male connector 9 preferably reaches the connector's mechanical clasp deep within the female connector. When the male connector 9 is inserted in the female connector, the housing 23 is pulled away from the female connector. If there is greater pullout resistance or mechanical tension of the female connector on the male connector 9 than provided by spring 29 between housing 23 and plunger 25, the male connector 9 will be held in place while the housing 23 slides over the plunger 25. The plunger 25 will continue to slide inside the housing 23 until the tension of the extending spring 29 becomes equal to or greater than the pullout resistance of the female connector, or until indicator key 26 abuts against extended band 22. As the plunger 25 slides inside of the housing 23, the indicator key 26 moves along a numbered scale to display a representation indicating the amount of force being applied to pull male connector 9 out of the female connector. The scale may directly provide an indication of the force applied, or may provide a general indication in arbitrary units. The user or technician may determine if a connector has passed or failed, i.e. is good or bad, based on the amount of pullout force measured. For example, a pull out force of 4 units may be considered a "pass" while a pull out force of 2 units may be considered a fail.

Those of skill in the art will appreciate that the sliding resistance or tension that between plunger 25 and housing 23 may be adjusted by selecting a spring with desired tension properties. The resistance provided by the spring is preferably a variable resistance proportional to the length of extension or displacement of the spring. The tension on the spring is preferably proportional to the length of extension of the spring. For example, a suitable spring may be chosen according to Hooke's law as follows:

$$F = -kx \qquad \text{Eq. 1}$$

Where F represents the force applied to or by the spring, k indicates a spring constant associated with the properties of the spring, and x indicates a distance of displacement of the spring from a rest position. The negative sign indicates that the force exerted by the spring is in direct opposition to the direction of displacement.

Figure 3A:
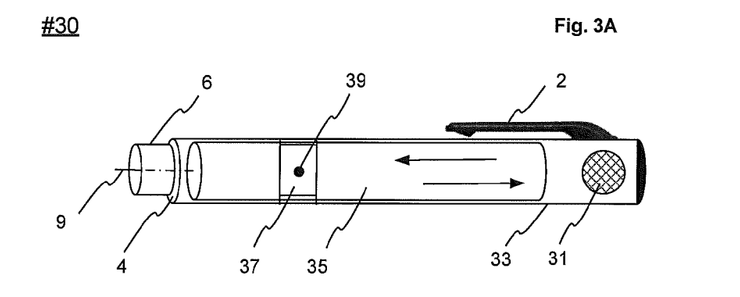
FIGS. 3A-3D illustrate another exemplary embodiment of the invention.
Figure 3B:
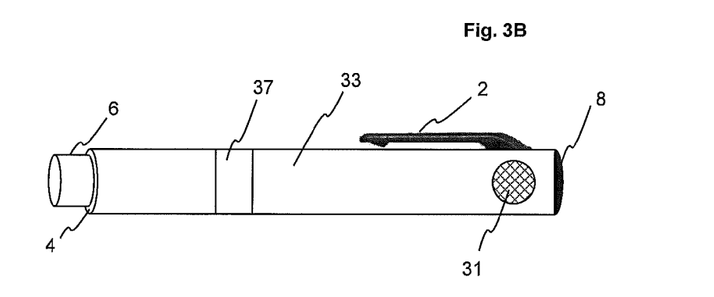
Figure 3C:
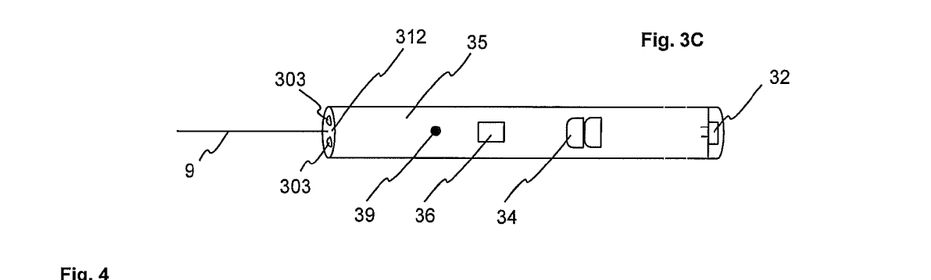
Figure 3D:
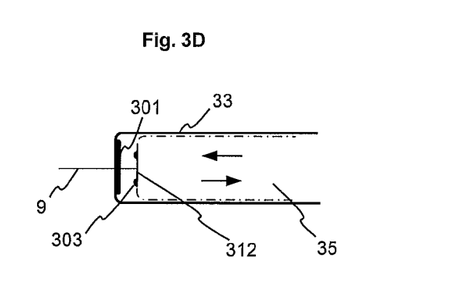
Figure 4:
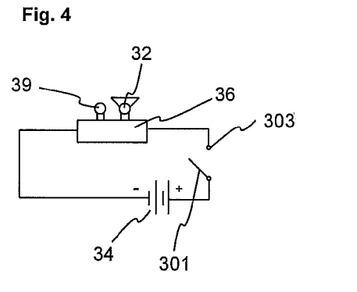
FIG. 4 illustrates a circuit schematic that may be used with the embodiment of FIGS. 3A-3D.

FIGS. 3A-4 illustrate another exemplary embodiment of the invention which uses a tool 30 with an electronic circuit and display to indicate a pass/fail condition. As illustrated in FIG. 3A, housing 33 may hold a plunger 35. As illustrated in FIG. 3B and blow up FIG. 3D, housing 33 may include an outer housing formed of a generally hollow cylindrical body, an alignment sleeve 6, an indicator 37, an interior front end 4, an interior back end 8, a mounting clip 2, and a port 31. Port 31 may be configured to allow an audible noise to pass from plunger 35. Housing 33 also includes a conductive area 301 which may be in the form of a metal plate or other conductive material.

As illustrated in FIG. 3C and blow up FIG. 3D, plunger 35 may include a speaker unit 32 capable of making an audible noise for a user to hear. Plunger 35 may also include LED 39, IC logic 36, battery 34, contacts 303, and male connector 9. Contacts 303 may be in the form of metal or other conductors. Contacts 303 are preferably connected to LED 39, IC logic 36, battery 34 and speaker 32 via wires or other conductors, not shown. FIG. 4 illustrates an exemplary circuit which schematically depicts the operation of tool 30. When the switch closes (formed by contacts 303 and conductive area 301), a circuit is closed, causing electrical current to be provided by battery 34 to IC logic 36, lighting LED 37 and activating speaker 32 to make an audible noise.

In operation, tool 30 may operate in a similar manner as tools 1 or 20. In one implementation, the plunger 25 slides inside of the housing 23 between a home position and an extended position. At the home position, the front end 312 of plunger 25 is positioned a predetermined distance away from the interior end of housing 33. In the extended measurement position, the front end 12 substantially abuts against the interior end 4 of housing 23, such that contacts 303 engage with conductive areas 301. When in the home position, the tool 30 is inserted into a female connector, such as an F-fitting, such that the male connector 9 preferably reaches the connector's mechanical clasp deep within the female connector. When the male connector 9 is inserted in the female connector, the housing 33 is pulled away from the female connector. If the pullout resistance of the female connector on the male connector 9 is greater than the sliding resistance provided between housing 33 and plunger 35, the male connector 9 will be held in place while the housing 33 slides over the plunger 35. The plunger 35 will continue to slide inside the housing 33 until the sliding resistance between housing 33 and plunger 35 becomes equal to or greater than the pullout resistance of the female connector, or until front end 312 of plunger 35 abuts against interior end 4 of housing 33, causing contacts 303 to engage conductive area 301. When contacts 303 engage conductive area 301, the electrical circuit is closed and LED 39 is activated to emit light. Speaker 32 may also be activated to emit an audible noise.

Those of skill in the art will appreciate that the LED 39 may be activated as steady light or as a blinking light. For example, the LED may flash for 2 seconds and the speaker may emit a tone or alarm for 2 seconds. Also, while LED 39 and speaker 32 are shown together on plunger 35, plunger 35 may contain only one of the two.

Figure 5A:
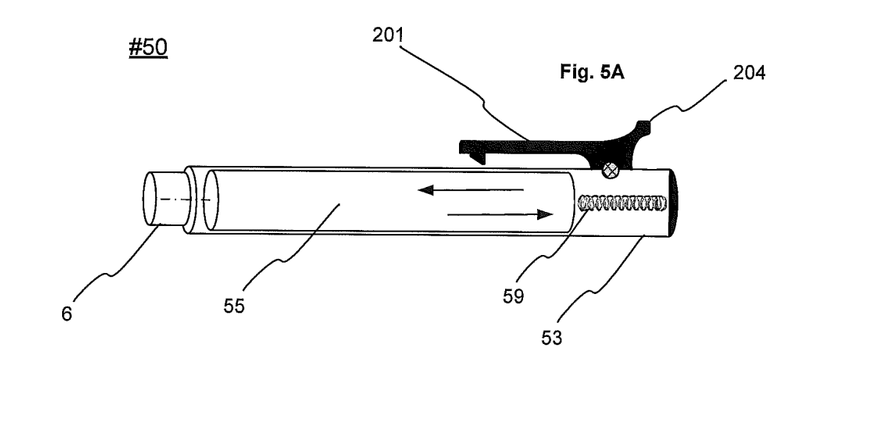
FIGS. 5A-5C illustrate another embodiment of the invention.
Figure 5B:
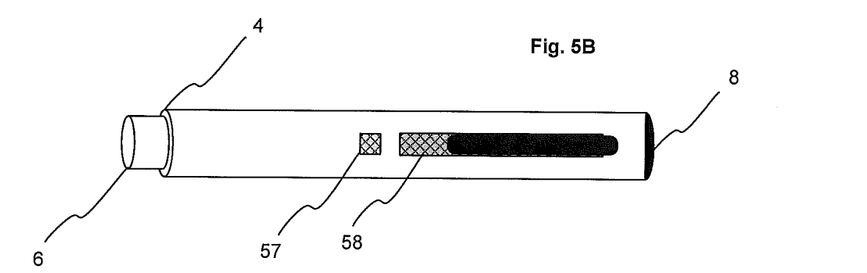
Figure 5C:
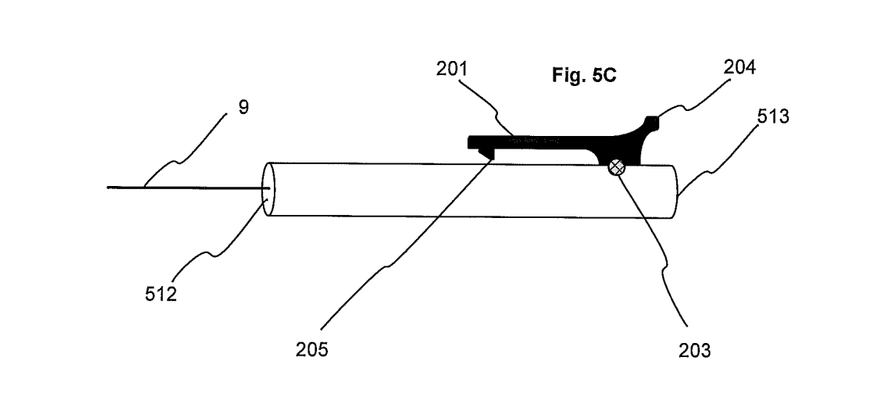

FIGS. 5A-5C illustrate another embodiment of the invention which uses a mechanized pullout force. As shown in FIG. 5A, tool 50 includes an outer housing 53 containing a plunger 55. Tool 50 operates in a similar manner as tools 1, 20, and 30 discussed above, however tool 50 uses a mechanized pullout force.

With reference to FIG. 5B, outer housing 53 includes a generally hollow body, an alignment sleeve 6, an interior front end 4, an interior back end 8, a clip slide opening 58 and a clip catch notch 57. The alignment sleeve 6 (front of the tool) may be sized and shaped to match the female connector under test and used to guide the tool on to the female connector, such as a cylindrical sleeve to mount on a typical F-fitting. Housing 53 may also include a spring mounting unit (not shown) to securely attach spring 59 onto housing 53. Those of skill in the art will appreciate that a variety of approaches may be used to attach spring 59 to housing unit 53, such as adhesives, screws, and/or inserting the end of the spring into a notch. The alignment sleeve also conceals most of the male connector 9 when the male connector is positioned in a home position. In operation, the alignment sleeve preferably helps the user to insert and remove the tool cleanly from the female connector.

As shown in FIG. 5C, plunger 55 includes load clip 201, which may be in the form of a mounting clip to mount onto an article of clothing. Load clip 201 is connected to plunger 55 at a pivot point 203 and includes a tab 205 and a back end 204. Back end 204 may be disconnected from plunger 55 to allow it to be pressed toward plunger 55 to raise tab 205 away from the body of plunger 55 in a lever action around pivot 203. Those of skill in the art will appreciate that a variety of techniques may be used to secure load clip 201 to plunger 55, such as being inserted in a notch in plunger 55 or adhered to plunder 55. Plunger 55 contains male connector 9, and has front end 12 and a rear end 13.

In one implementation, the plunger 25 slides inside of the housing 23 between a home position and an extended position. At the home position, the front end 12 of plunger 55 is positioned a predetermined distance away from the interior end 4 of housing 53. At the extended position, the load clip 201 is moved forward to the notch position, and tab 205 engages with notch 57 to hold load clip 201 in the forward position. When in the home position, tool 50 is in a steady or relaxed state such that plunger 55 is not being moved by spring 59. In the home position, spring 59 may be in a substantially relaxed state, and/or the motion of plunger 55 toward interior end 8 may be stopped by a fixed object (not shown) within housing 53. When plunger 55 is in the extended position, spring 59 is in a stretched or tensioned state. When plunger 55 is in the extended state, male connector 9 is inserted into a female connector, such as an F-fitting, such that the male connector 9 preferably reaches the connector's mechanical clasp deep within the female connector. When the male connector 9 is inserted in the female connector, the user releases tab 205 from its engagement with notch 57, causing the tension of spring 59 to provide a pullout force which attempts to pull male connector 9 out of the female connector. If there is greater pullout resistance of the female connector on the male connector 9 than pullout force provided by spring 59 between housing 53 and plunger 55, the male connector 9 will be held in place, indicating a good female connector. If the pullout force of spring 59 is greater than the pullout resistance of the female connector, the plunger 55 will be pulled back and male connector 9 withdrawn from the female connector, indicating a failed female connector.

Spring 59 is preferably chosen and tuned to exert a predetermined pullout force when load clip 201 is locked in the extended position by engagement with notch 57. For example, a pullout force of 25 grams for a period of 10 seconds may be used for an implementation testing an F connector. The compressed spring 59 when in the locked position may posses a potential energy according to the following equation:

$$1. \quad U = \tfrac{1}{2}kx^2 \qquad\qquad \text{Eq. 2}$$

Where U represents the restoring force of the tensioned spring, i.e. the force to return the spring to an equilibrium or relaxed state. K represents a spring constant, and x represents a displacement of the spring.

The disengagement of tab 205 from notch 57 to activate the test by activation of the application of the pullout force by spring 59 may be performed by a variety of ways. For example, a user could simply lift tab 205 out of notch 57. Alternatively, a user may be able to press on the back end 204 of load clip 201 causing it to pivot on pivot point 203, lifting tab 205 out of notch 57.

Figure 6A:
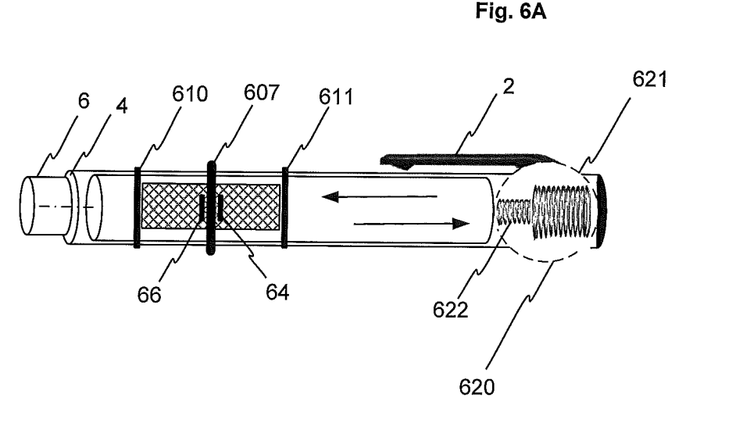
FIGS. 6A-6C illustrates another embodiment of the invention.
Figure 6B:
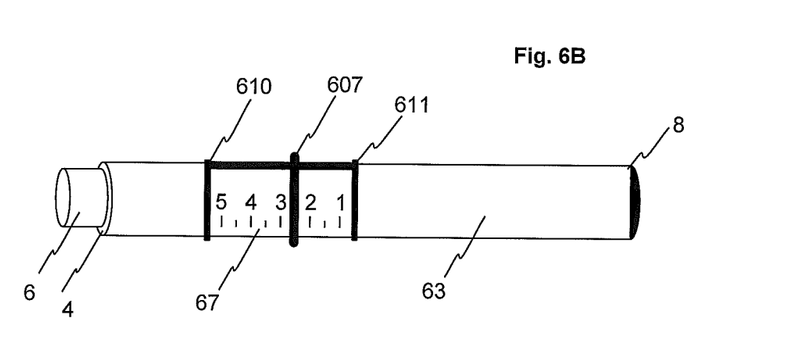
Figure 6C:
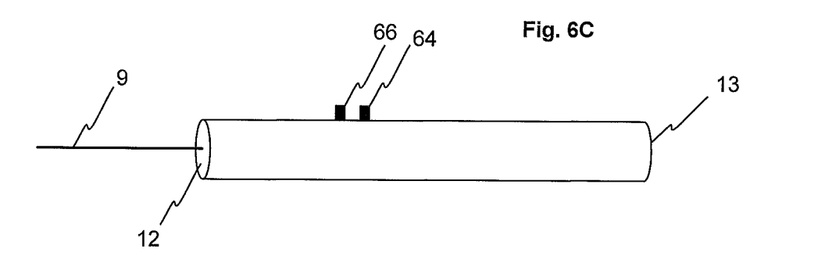

FIGS. 6A-6C illustrates another embodiment of the invention which may measure a push-in resistance or force as well as a pullout resistance or force. As shown in FIG. 6A, tool 60 includes an outer housing 63 containing a plunger 65. Tool 60 operates in a similar manner as tools 1, 20, and 30 discussed above, however tool 60 measures both a push-in resistance and a pullout resistance in testing a female connector.

FIG. 6B illustrates further details of housing 63. As shown in FIG. 6B, housing 63 may include an outer housing formed of a generally hollow body, an alignment sleeve 6, an indicator 67, an interior front end 4, an interior back end 8, and a mounting clip 2. Housing 63 may also include a spring mounting unit (not shown) to securely attach a spring unit 620, shown as containing spring 621 and 622. Those of skill in the art will appreciate that a variety of approaches may be used to attach spring unit 620 to housing unit 63, such as adhesives, screws, and/or inserting the end of the spring into a notch. Indicator 67 may include a fixed inner band 611, a fixed outer band 610, and a movable measuring band 607.

FIG. 6C illustrates further details of plunger 65. The plunger 65 contains male connector 9, indicator keys 66 and 64, a front end 12 and a back end 13. In one implementation, the plunger 65 slides inside of the housing 63 between a home position and a measurement position. When in the home position, tool 60 is in a steady or relaxed state such that plunger 65 is not being moved by spring unit 620, such as not being pushed or pulled. In the measurement position, plunger 65 is being moved by the spring unit 620 to test the push-in or pullout resistance. When in the home position, the tool 60 is inserted into a female connector. As the male connector 9 is being inserted in the female connector, the push-in resistance or insertion tension of the female connector will cause plunger 65 to be pushed to the back end 8 of housing 63 until spring unit 620 provides a sufficient resistive force against plunger 65 equal to or greater than the insertion tension of the female connector, or until measurement band 607 abuts against inner band 611. As plunger 65 is being pushed toward back end 8, key 66 moves measurement band 607 to indicate an amount of push-in force applied to overcome the insertion tension the female connector, which may be equated to the push-in resistance of the female connector.

When male connector 9 is inserted in the female connector, tool 60 is pulled away from the female connector by a user. If there is greater mechanical tension of the female connector on the male connector 9 than provided by spring unit 620 between housing 63 and plunger 65, the male connector 9 will be held in place while the housing 63 slides over the plunger 65. The plunger 65 will continue to slide inside the housing 63 until the force created by the tension of the extending spring unit 620 becomes equal to or greater than the pullout resistance of the female connector, or until measurement band 607 abuts against outer band 610. As the plunger 65 slides inside of the housing 63, the indicator key 26 moves measurement band 607 along a numbered scale to display a representation indicating the amount of force being applied to pull male connector 9 out of the female connector as the pullout resistance.

The scale may directly provide an indication of the force applied, such as displaying in units of grams or may provide a general indication in arbitrary units. The user or technician to determine if a connector has passed or failed, i.e. is good or bad, based on the amount of push-in and/or pullout force measured. For example, if the push-in force is greater than a predetermined threshold, e.g. 4 units, then the connector may be designated as being good. If the push-in force is less than a predetermined threshold, then it may be presumed that the female connector does not make adequate contact with male connector 9, and the female connector may be determined to be bad. In another example, a pull out force of 4 units may be considered a "pass" while a pull out force of 2 units may be considered a fail.

Those of skill in the art will appreciate that the tension that the resistive mechanical tension between plunger 65 and housing 63 may be adjusted by selecting a spring unit 620 with desired tension properties. For example, spring 621 may be chosen to provide a predetermined amount of pullout force measurement, and spring 622 may be chosen to provide a predetermined amount of push-in force measurement. The tension on the spring is preferably proportional to the length of extension of the spring, such that the extended spring indicates a greater amount of tension force by the female connector than the non-extended spring.

While a measurement scale is shown in tool 60, those of skill in the art will appreciate that a pass/fail band unit as discussed in connection with FIGS. 1A-1C may be used. Also, those of skill in the art will appreciate that the electronic indicator of FIGS. 3A-3C may be used, or an electronic scale display may be used.

While several embodiments have been described separately for illustrative purposes, combinations of the embodiments may be implemented. For example, the measurement indicator approach of FIGS. 2A-2C may be used with any of tools 1, 30, 50, or 60, and vice versa. Likewise, the resistance mechanisms of tools 1, 30, 50 and 60 may be combined or used with other resistance mechanisms disclosed.

The tool permits the user to quickly test female connectors while mounted on an electronic device. The tools allows a technician to quickly diagnose a faulty female connector, reducing repair time and repair costs associated with failed electronic devices. The tool also allows many electronic components to be tested in a short period of time, further reducing repair times. The tool is preferable small and lightweight and can be easily and conveniently carried by a user. The tool also enables testing of many electronic devices without the need to disconnect the devices from a power source or to power down the devices from other connections, such as a network connection.

While the embodiments have been described with reference to examples, those skilled in the art will be able to make various modifications to the described embodiments without departing from the true spirit and scope. The terms and descriptions used herein are set forth by way of illustration only and are not meant as limitations. In particular, although the implementations and methods have been described by examples, steps of the methods may be performed in different orders than illustrated or simultaneously. Those skilled in the art will recognize that these and other variations are possible within the spirit and scope as defined in the following claims and their equivalents.

What is claimed is:

1. A connector testing tool comprising:
   a housing having a hollow body;
   a plunger contained in the hollow body and being movable within said hollow body;
   a male connector end connected to the plunger to be inserted in a female connector to be tested;
   an alignment sleeve having a shape for mounting the tool on to the female connector, wherein the alignment sleeve conceals a portion of the male connector end when the male connector end is in a home position, and wherein the shape of the alignment sleeve corresponds to a shape of the female connector for guiding, during operation, an insertion and removal of the male connector from the female connector; and
   a resistance mechanism which provides a predetermined amount of force resisting movement between said housing and said plunger,
   wherein the housing pulls away from the female connector when the male connector is inserted in the female connector, and the resistance mechanism resists movement of said plunger in the housing when said male connector is being pulled out of the female connector being tested.

2. The connector testing tool of claim 1, further comprising an indicator which indicates a pass or fail condition of said female connector being tested.

3. The connector testing tool of claim 2, wherein said indicator includes a pass band on said plunger.

4. The connector testing tool of claim 2, wherein said indicator includes a scale band on said plunger.

5. The connector testing tool of claim 4, wherein said indicator includes a movable measurement band which is to be moved by a key on said plunger.

6. The connector testing tool of claim 2, wherein said indicator includes an LED on said plunger.

7. The connector testing tool of claim 2, wherein said indicator includes an electronic device configured to make an audible noise.

8. The connector testing tool of claim 1, wherein said resistance mechanism includes resistance bands on said plunger.

9. The connector testing tool of claim 1, wherein said resistance mechanism includes a spring.

10. The connector testing tool of claim 1, wherein said resistance mechanism is configured to resist movement of said plunger while pulling said male connector end out of said female connector, and said resistance mechanism is configured to resist movement of said plunger while pushing said male connector end into said female connector.

11. The connector testing tool of claim 10, further including an indicator which indicates an amount of pullout resistance and an amount of push-in resistance.

12. A method of testing a connector comprising:
   aligning the connector for mounting on to a female connector via an alignment sleeve, wherein the alignment sleeve conceals a portion of a male connector end when the male connector end is in a home position, and wherein a shape of the alignment sleeve corresponds to a shape of the female connector for guiding, during operation, an insertion and removal of the male connector from the female connector;
   inserting the male connector end of a testing tool into the female connector, the testing tool having an outer housing holding a movable inner plunger, the male connector end being mounted on the inner plunger, wherein the housing pulls away from the female connector when the male connector is inserted in the female connector;
   providing an indication of movement of said plunger within said outer housing, said movement of said plunger within said housing being resisted between said outer housing by a resistance mechanism;
   determining if said connector has passed based on an amount of movement of said plunger with respect to said outer housing.

13. The method of claim 12, wherein providing an indication of movement of said plunger includes proving an indication of a minimum plunger movement distance for a pass designation.

14. The method of claim 12, wherein providing an indication of movement of said plunger includes proving an indication of an amount of force exerted to move said plunger.

15. The method of claim 12, wherein said female connector is determined to pass if movement of said plunger indicates a predetermined pullout force is needed to remove said male connector from said female connector.

16. The method of claim 12, wherein said female connector is determined to pass if movement of said plunger indicates a predetermined push-in force is needed to insert said male connector into said female connector.

* * * * *